Figure 1:
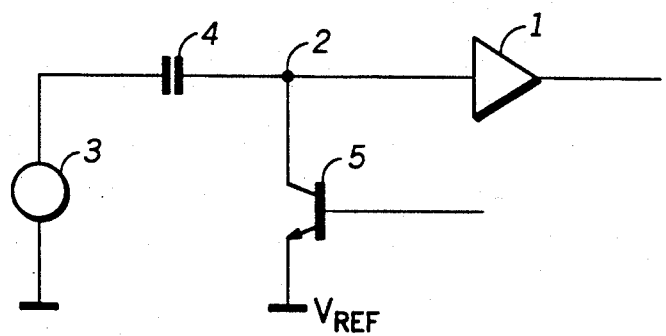

United States Patent [19]

Gay

[11] Patent Number: 5,192,885
[45] Date of Patent: Mar. 9, 1993

[54] CLAMP CIRCUIT

[75] Inventor: Michael J. Gay, Vaud, Switzerland

[73] Assignee: Motorola, Inc., Schaumburg, Ill.

[21] Appl. No.: 796,979

[22] Filed: Nov. 25, 1991

[30] Foreign Application Priority Data

Dec. 13, 1990 [GB] United Kingdom ............... 9027044

[51] Int. Cl.[5] .................... H03K 5/08; H04N 9/64; H04N 5/18
[52] U.S. Cl. .................................. 307/555; 307/264; 307/562; 358/33; 358/172
[58] Field of Search ............... 307/546, 549, 555, 562, 307/264; 358/33, 34, 171, 172

[56] References Cited

U.S. PATENT DOCUMENTS 4,564,863 1/1986 Chameroy et al. ................ 307/555

FOREIGN PATENT DOCUMENTS 0212068 10/1985 Japan ................................. 358/172

Primary Examiner—John Zazworsky
Attorney, Agent, or Firm—Michael D. Bingham

[57] ABSTRACT

A clamp circuit is described in which a video signal is capacitively coupled to an amplifier which has enabled and disabled states. An operational amplifier receives the output of the amplifier and a reference voltage and the output of the operational amplifier is fed back to the inputs of both the amplifier and the operational amplifier. The loops may be selectively disconnected and the amplifier selectively disabled so that the output of the amplifier has the same level during each of three modes namely clamp mode when the video signal is known to be black, image mode during normal operation when the video signal returns to black, and during blank mode initiated at any other desired time.

5 Claims, 1 Drawing Sheet

-PRIOR ART-

-PRIOR ART-

ས,192,885

CLAMP CIRCUIT

This invention relates to a clamp circuit and is particularly applicable for clamping a video signal at a predetermined black level.

Television signals are characterised by an asymmetrical variation about a black level. It is necessary at predetermined times, such as flyback, to reproduce a precise black level for the signal processing circuits.

In a known video clamp, the video signal is fed via a capacitor to a node at which a reference voltage is established at times when the video signal is known to be black. The capacitor is charged to the difference between the signal black level and the reference voltage so that the entire video signal is translated to the reference level.

In one known arrangement the capacitor is coupled to the input of an amplifier, which input is also coupled to the reference voltage via a switch, such as a saturating bipolar transistor.

As an alternative, the voltage on the capacitor is compared in a comparator with the reference voltage and the output of the comparator is fed to correct the capacitor voltage.

It is sometimes necessary to operate in so called blanking mode when the establishment of black level is required at times other than when the video signal is black. With the prior art circuits described above, it is assumed that the reference level is the clamped black level but this is not the case, because an error is generated between the reference voltage and that established on the capacitor, due to offset voltages in the switch and comparator respectively. In colour television circuits where clamping is done before the colour difference signals are matrixed, these errors in the black level clamping, which result in different clamping and blanking levels, result in errors in hue.

This invention seeks to provide a clamp circuit in which the above problems are mitigated.

According to the present invention there is provided a clamp circuit for establishing a predetermined clamp voltage, the circuit comprising a signal input terminal for receiving an input signal, a first amplifier having an input terminal and an output terminal; the input terminal of the first amplifier being capacitively coupled to the signal input terminal; means for selecting operation of the first amplifier; an operational amplifier having a first input coupled to the output of the first amplifier and second input for receiving a reference voltage and first and second selectively operable feedback loops coupled between the output of the operational amplifier and the inputs of the first and operational amplifiers respectively, whereby the output of the first amplifier may be selectively clamped to the predetermined clamp voltage in dependence upon the selective operation of the feedback loops and the first amplifier.

The first amplifier may typically be a unity gain amplifier, such as an emitter follower.

The first and second feedback loops may be rendered selectively operable by means of respective switches in the loops.

The switches may comprise semiconductor switches, typically bipolar transistor switches.

Figure 2:
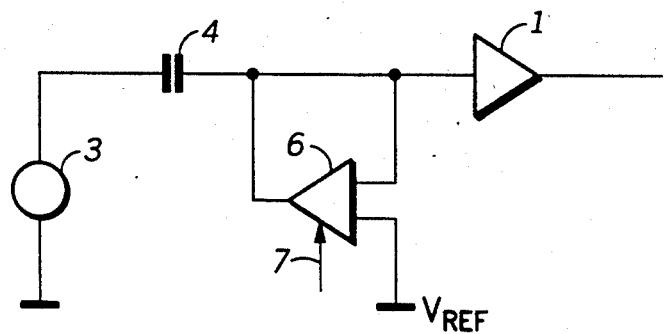
Figure 3:
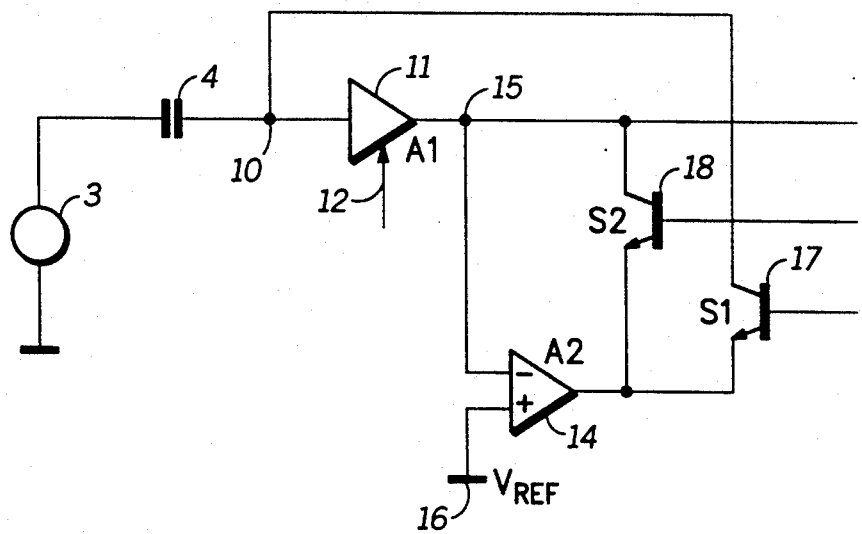

An exemplary embodiment of the invention will now be described with reference to the drawings in which;

FIG. 1 shows a known clamp circuit
FIG. 2 shows another known circuit; and
FIG. 3 shows an embodiment of a clamp circuit in accordance with the present invention Referring to FIG. 1, the circuit comprises an amplifier 1 having an input 2 capacitively coupled to a source 3 of video signals by means of a capacitor 4. At times when the video signal is known to be black, the input 2 to the amplifier 1 is coupled to a predetermined reference voltage by means of a controllable transistor switch 5 coupled between the amplifier input and the reference voltage.

In the second prior art embodiment of FIG. 2, where like parts to FIG. 1, have the same numbers, the transistor switch is replaced by a negative feedback loop including a comparator 6, which may be rendered operable by means of a control signal applied at an enable input 7. The comparator 6 compares the input voltage at the input 2 of the amplifier with the reference voltage $V_{ref}$ and by feedback action corrects the voltage at the input 2.

In both the above known circuits, the voltage established at the input 2 of the amplifier 1 is not precisely $V_{ref}$, due to offset voltages of the transistor 5 and comparator 6.

In television circuits there is a need to utilise the clamped black level at times when the video signal is not black. In the prior art circuits there is no means of establishing such a clamped black level. Thus use is made directly of the reference voltage $V_{ref}$ on the assumption that $V_{ref}$ is the same as the clamped voltage when the video signal is black.

As seen this is not the case and an error results between the clamping level and that of $V_{ref}$, used in place of the clamping level when the video signal is not black. In television circuits where clamping is done before the colour difference signals are matrixed, the errors in the clamping level and $V_{ref}$ result in unacceptable hue errors.

Referring now to FIG. 3 where like parts to FIGS. 1 and 2 are similarly referenced, the video signal is now fed to input 10 of an amplifier 11 which may be enabled or disabled in dependence upon a signal applied at a control input 12. The amplifier 11 is typically a unity gain amplifier such as may be realised by an emitter follower stage.

An operational amplifier 14 has one input 15 coupled to the output of the amplifier 11 and a second input 16 coupled to a reference voltage $V_{ref}$.

The output of the operational amplifier 14 feeds two feedback loops, the first via controllable switch S1 formed by bipolar transistor 17 to the input of the amplifier 11, and the second loop via controllable switch S2, formed by bipolar transistor 18 to the input 15 of the same amplifier 14.

The circuit operates in three modes, clamp, blank and image which are illustrated in the table below, where amplifiers 11 and 14 are designated A1 and A2 respectively:

| MODE | S1 | S2 | A1 | OUTPUT |
| --- | --- | --- | --- | --- |
| CLAMP | CLOSED | OPEN | ENABLED | $V_{ref}$ + A2 OFFSET |
| BLANK | OPEN | CLOSED | DISABLED | $V_{ref}$ + A2 OFFSET |
| IMAGE | OPEN | OPEN | ENABLED | $V_{ref}$ + A2 OFFSET + VIDEO LEVEL W.R.T. BLACK |

In the clamp mode, which is only activated when the video signal is known to be black, the amplifier A1 is enabled and the switches S1 and S2 are closed and open respectively. The negative feedback loop through the switch S1 results in the capacitor 4 being charged so that the voltage at the input to A1 is the reference voltage $V_{ref}$, applied to the positive input of the operational amplifier 14, (designated A2), plus the sum of the offset voltages of A1 and A2. The voltage at the output of A1, and thus the output of the circuit in the clamp mode, will be $V_{ref}$ plus A2 offset, all other offset terms being divided by the gain of the feedback loop and thus being negligible.

In the blank mode, the amplifier A1 is disabled by means of a control signal at its control input 12 and the switches S1 and S2 are reversed so that S1 is open and S2 closed. The output voltage of the circuit will thus be set at the same level of $V_{ref}$ plus the offset voltage of A2, all other offsets being made negligible by division by the gain of the feedback loop. Thus in this mode exactly the same output voltage is established but the output is isolated from the video signal, which may have any value at this time.

Finally in image mode, both the switches S1 and S2 are open thus disabling both feedback loops. The video signal is thus fed through the amplifier A1 to the output. When the video signal is at black level the output voltage will be the voltage previously established at the input to A1 during the clamp mode, less the offset voltage of A1. Since the voltage established at the input of A1 during clamp mode is $V_{ref}$ plus offset voltages of A1 and A2, the resultant output voltage will be $V_{ref}$ plus A2 offset, which is exactly the same as during clamp and blank modes.

The circuit thus provides output voltages which are exactly the same in the clamp mode, initiated only when the input video signal is black, in the blank mode, initiated at any time and in the image state when the video signal is black.

The invention has been described by way of example and modifications may be made without departing from the scope of the invention. For example the switches S1 and S2 may be implemented in any other convenient way. Similarly the operational amplifier A2 may have a disabled state during image mode or may be of a type designed to maintain low input current even if overdriven and to be able to recover rapidly from such overdrive. The only requirement is that its offset voltage remains substantially constant in each of the three operational modes.

I claim:

1. A clamp circuit for establishing a predetermined clamp voltage, the circuit comprising a signal input terminal for receiving an input signal, a first amplifier having an input terminal and an output terminal; the input terminal of the first amplifier being capacitively coupled to the signal input terminal; means for selecting operation of the first amplifier; an operational amplifier having a first input coupled to the output of the first amplifier and a second input for receiving a reference voltage and first and second selectively operable feedback loops coupled between the output of the operational amplifier and the inputs of the first and operational amplifiers respectively, whereby the output of the first amplifier may be selectively clamped to the predetermined clamp voltage in dependence upon the selective operation of the feedback loops and the first amplifier.

2. The circuit of claim 1 wherein the first amplifier is a unity gain amplifier.

3. The circuit of claim 2 wherein the unity gain amplifer is an emitter follower.

4. The circuit of claim 1 wherein the first and second feedback loops are rendered selectively operable by means of respective switches in the loops.

5. The circuit of claim 4 wherein the switches are bipolar transistor switches.

* * * * *